United States Patent [19]

Vajdic

[11] Patent Number: 4,794,278

[45] Date of Patent: Dec. 27, 1988

[54] STABLE SUBSTRATE BIAS GENERATOR FOR MOS CIRCUITS

[75] Inventor: Branislav Vajdic, Saratoga, Calif.

[73] Assignee: Intel Corporation, Santa Clara, Calif.

[21] Appl. No.: 139,855

[22] Filed: Dec. 30, 1987

[51] Int. Cl.[4] ........................ H03K 17/22; H03K 3/01

[52] U.S. Cl. ................................ 307/297; 307/296 R; 307/351

[58] Field of Search .................. 307/296.2, 296.8, 304, 307/351, 360

[56] References Cited

U.S. PATENT DOCUMENTS

| | | | |
|---|---|---|---|
| 4,142,114 | 2/1979 | Green | 307/304 |
| 4,356,412 | 10/1982 | Moench et al. | 307/304 |
| 4,439,692 | 3/1984 | Beekmans et al. | 307/297 |
| 4,454,431 | 6/1984 | Hoffmann et al. | 307/296 R |
| 4,710,647 | 12/1987 | Young | 307/297 |
| 4,752,699 | 6/1988 | Cranford, Jr. et al. | 307/297 |

FOREIGN PATENT DOCUMENTS

| | | |
|---|---|---|
| 0173980 | 8/1985 | European Pat. Off. . |
| 0050019 | 3/1983 | Japan . |
| 2151823 | 11/1984 | United Kingdom . |

OTHER PUBLICATIONS

"Substrate Voltage Generator with Compensation for Depletion-Mode and Enhancement-Mode Field Effect Transistors", IBM Technical Disclosure Bulletin, vol. 24, No. 7A, Dec. 1981, by G. C. Luckett.

R. A. Blanschild et al., "A New NMOS Temperature-Stable Voltage Reference"; IEEE J. Solid-State Circuits, vol. SC-13; Dec. 1978; pp. 67-73.

*Primary Examiner*—Stanley D. Miller

*Assistant Examiner*—Richard Roseen

*Attorney, Agent, or Firm*—Blakely, Sokoloff, Taylor & Zafman

[57] ABSTRACT

A circuit for controlling substrate bias voltage of a MOS semiconductor substrate. A first level detector monitors the substrate voltage and when the substrate bias falls below a threshold value, the first level detector couples an oscillator to cause a charge pump to pump charges into the substrate until the threshold level is again reached. A second detector operates as an excess negative voltage detector. This second detector monitors the substrate and when the bias voltage exceeds a predetermined limit, the second detector activates a clamper which drives the substrate toward ground potential until the bias voltage is again under the predetermined limit. By this technique the substrate bias is kept between the first threshold level and the maximum limit level. The first and second detectors are comprised of two transistor circuits, wherein the first leg is comprised of a depletion transistor and at least one enhancement transistor coupled between the supply voltage and the substrate. The second leg is comprised of two depletion transistors coupled between the supply voltage and its return. The junction of the depletion and the enhancement transistor of the first leg is coupled to the gate of one of the depletion transistors in the second leg such that the second leg is biased by the voltage on the junction of the transistors of the first leg which monitors the substrate voltage. The two legs determine the activation point of the detectors. The second detector is made to have at least one more enhancement transistor than the first detector to establish the limit level to be above that of the threshold level.

13 Claims, 1 Drawing Sheet

STABLE SUBSTRATE BIAS GENERATOR FOR MOS CIRCUITS

BACKGROUND OF THE INVENTION

1.Field of the Invention.

The present invention relates to MOS Intergrate Circuit devices and more specifically to a back bias generator for complementary metal oxide semiconductor (CMOS) processes.

2. Prior Art

In the design of MOSFETs (metal-oxide semiconductor field- effect transistor), isolation considerations for high voltage circuitry often require the use of a back bias generator, especially on a device utilizing present CMOS processes. Various methods are known in the prior art for generating and regulating back bias voltages, such techniques being disclosed in U.S. Pat. No. 4,142,114; U.K. Patent GB No. 2,151,823; and European Patent EP No. 173,980. However, with the advent of the textured poly EEPROM (electrically erasable programmable read only memory) technology, voltages in excess of 20 volts DC are encountered by the semiconductor device. Because the FETs threshold voltage is a function of the back bias voltage (VBB), it is desirous to provide a back bias voltage which is substantially insensitive to temperature and power supply voltage changes.

In analyzing MOSFET behavior, the worst case field threshold isolation requirements dictate the least negative voltage value that the back bias generator needs to supply under worst case temperature and power supply conditions. The most negative voltage value of the back bias voltage generator directly influences the junction break-down voltage of the transistor and, therefore, this most negative value of VBB is the worst case condition for the junction break-down voltage of the transistor. The tradeoff between field transistor threshold voltage and junction break-down voltage is further constrained, in that an increase in the field implant dosage, which is achieved in order to increase the field transistor threshold voltage, will lead to a lower junction break-down voltage, and vice versa.

Therefore, based on these explanations, it is appreciated that a VBB which is insensitive to temperature and power supply voltage variations will alleviate high voltage isolation problems.

SUMMARY OF THE INVENTION

A circuit for controlling a MOS substrate back bias generator is described. The circuit is comprised of a first loop which maintains the substrate at a voltage above a predetermined threshold level and a second loop which prevents the voltage of the substrate from exceeding a predetermined limit level, such that the substrate voltage is clamped between the two levels.

The first loop is comprised of a level detector, an oscillator and a charge pump coupled in a closed loop fashion to the substrate. A first level detector in the first loop detects the voltage of the substrate when the voltage is less negative than a predetermined threshold value. When this occurs the first level detector causes the oscillator signal to be coupled to the charge pump, wherein the charge pump pumps the substrate to cause an increase in the negative bias of the substrate. When the substrate bias voltage exceeds the predetermined negative threshold value, the level detector decouples the oscillating signal to the charge pump thereby deactivating the charge pump and causing the pumping action to cease.

A second detector in the second loop monitors the substrate voltage such that the detector is activated when the magnitude of the substrate voltage exceeds a predetermined negative limit level. The detector is coupled to a clamper. When the substrate voltage exceeds this limit level, the clamper is activated and attempts to limit (clamp) the extent of the substrate voltage.

Each of the first and the second level detectors are comprised of two transistor circuits. A first transistor circuit is comprised of a depletion transistor and at least one enhancement transistor coupled in series between VCC and VBB biasing line to the substrate. A second transistor circuit is comprised oof two depletion type devices coupled in series between VCC and ground. The junction of the depletion and enhancement transistor of the first circuit is coupled to the gate of the depletion transistor which is coupled to gruund in the second circuit. The control output is obtained from the junction of the two depletion transistors in the second circuit. The second circuit provides the switching to activate or deactivate the detector output control signals.

The use of a depletion device and an enhancement device allows the detectors to be substantially imeervious to temperature and power supply voltage variations of the first order. Further, a depletion device is utilized as a load device in each of these transistor circuits.

DETAILED DESCRIPTION OF THE PRESENT INVENTION

Figure 1:
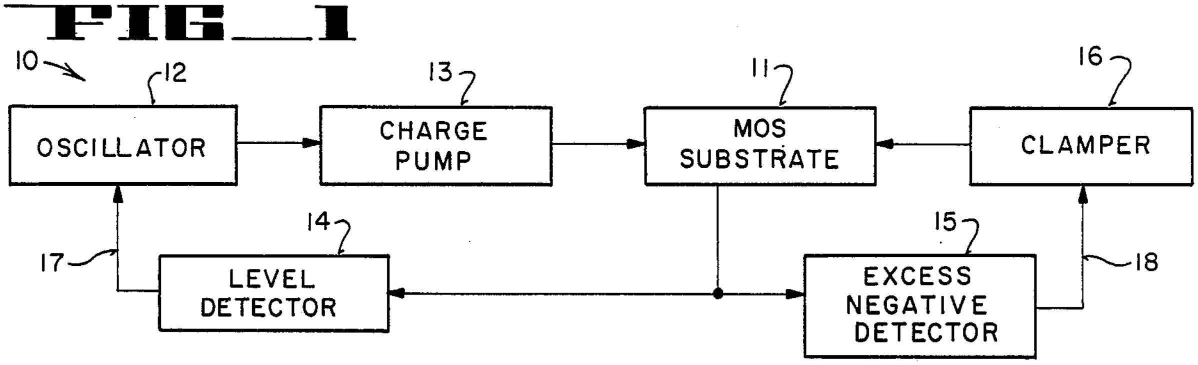
FIG. 1 is a circuit block diagram showing the main elements of the present invention.

The present invention describes a circuit for providing voltage control of MOS substrate back bias. In the following description, numerous specific details are set forth such as specific circuit components, voltage values, etc., in order to provide a thorough understanding of the present invention. It will be obvious, however, to one skilled in the art that the present invention may be practiced without these specific details. In other instances, well-known circuits have not been described in detail in order not to unnecessarily obscure the present invention.

PRIOR ART

A typical prior art substrate bias generator is described in U.K. Pat. No. GB 2,151,823, in which a circuit block diagram depicting a MOS substrate, a controlled oscillator, a charge pump and a level detector is shown. In such prior art circuit, if substrate voltage extends beyond the switching point of the detector, the oscillator is disabled and no further negative pumping is possible. Further, if an event external to the substrate biasing circuit forces the substrate to a more negative voltage value, the circuit is not capable of compensation to bring the substrate to a desired level. Such a problem typically occurs in high voltage EEPROM circuits when all of the columns of an EEPROM array are simultaneously discharged from a high voltage value. Such high negative values of the substrate voltage are normally attributed to the capacitive coupling between the columns of the EEPROM array and the substrate.

In one approach to controlling the MOS substrate bias an attempt is made to keep VBB at a predetermined value as the factors affecting its value change. UK Patent No. GB 2,151,823, as well as European Pat. No. EP 173,980 describe one such approach. In the UK Patent reference, the substrate voltage is regulated to the value of the depletion device threshold voltage. However, high voltage technologies, such as used for various EEPROM circuits, often require a VBB value that is more negative than a depletion device threshold voltage. Further, it is desirous to have a temperature compensation of the device. Without temperature compensation, performance of the level detector over the extended temperature range, typically −55 to +125 degrees Celsius, will exhibit significant operating characteristic variations as temperature changes. Although the EP No. 173,980 Patent uses enhancement devices, it too requires temperature compensation.

In a second approach described in US Pat. No. 4,142,114, it maintains the threshold voltage of the enhancement FET at a predetermined level by automatically adjusting the substrate bias voltage to compensate for the factors which tend to change the threshold voltage of the device. In this reference, reference voltage is set at the desired enhancement transistor threshold voltage level. The gate of the enhancement device is connected to the reference voltage and its substrate is connected to VBB. In this type of a circuit, the state of the output of the inverter depends on the value of the reference voltage and also on the threshold voltage of the enhancement transistor which in turn is dependent on the substrate voltage. The output of the detector is used to adjust the duty cycle of the oscillator and ultimately the value of VBB in such a way that the threshold voltage of the enhancement transistor is maintained at a value equal to the reference voltage. Because the threshold voltage of the enhancement transistor is a relatively weak function of VBB, at a typical VBB operating range (−3 to −4 volts), it will take a large change in VBB to compensate for tendency of the threshold voltage to change as temperature or process parameters vary. As the threshold voltage of the isolation field transistor is determined by the process parameters which are independent of those for the enhancement device, a dramatically changing VBB may cause isolation field devices to turn on at undesirable voltage levels.

It is appreciated, then, that what is needed is a circuit to provide a substrate voltage regulation scheme that will regulate VBB to a level which exhibits minimal dependence on temperature and power supply voltage variations.

PRESENT INVENTION

Referring to FIG. 1, it illustrates a schematic block diagram of a substrate bias generator of the ppresent invention. Circuit 10 is comprised of a MOS substrate 11 coupled to a level detector 14 which is coupled to an oscillator 12, and oscillator 12 is then coupled to a charge pump 13. Charge pump 13 is also coupled to MOS substrate 11, such that blocks 11–14 form a first closed loop 17. Circuit 10 is also comprised of an excess negative voltage detector 15 and a clamper 16. Substrate 11 is coupled to detector 15 which is then coupled to clamper 16. Clamper 16 is also coupled to substrate 11 to form a second closed loop 18, wherein MOS substrate 11 being the common element of both loops 17 and 18. As used in the preferred embodiment, substrate bias voltage is negative in value due to the use of p-type material for substrate 11.

The function of the first loop 17 is to maintain the substrate 11 at a certain negative reference value. Level detector 14 measures the voltage of substrate 11. If the voltage of substrate 11 becomes less negative then the predetermined reference value, level detector 14 transmits a signal to oscillator 12, activating oscillator 12. Oscillator 12 when activated causes charge pump 13 to turn on and charge pump 13 charges substrate 11 to force substrate 11 to a more negative voltage level. When the desired negative voltage reference level is reached, level detector 14 senses this value and deactivates oscillator 12, which in turn shuts off charge pump 13. In this first loop 17, if VBB of the substrate becomes more negative than the reference level of the detector 14, the oscillator 12 is disabled, disabling charge pump 13, and thus no further negative pumping is possible. However, if an event external to the substrate biasing loop 17 causes substrate 11 to reach a more negative voltage value, loop 17 remains deactivated and provides no control beyond substrate 11 reaching the predetermined reference level. Such a condition occurs in high voltage EEPROM circuits when all columns of an array are simultaneously discharged from a high voltage condition. Large negative values of the substrate voltage occur due to the capacitive coupling between columns of the array and the substrate. A highly negative voltage of the substrate is undesirable, because of its effect on the switching points of sensitive circuits, such as input buffers, and its influence on the junction breakdown voltage.

In order to compensate for the excess negative voltage which a substrate 11 may experience, second loop 18 is provided to prevent the substrate 11 from becoming more negative than a second reference level. Function of the excess negative level detector 15 is to detect VBB values which are more negative then this second detection point. Once the VBB value attempts to exceeds this excess negative voltage level, detector 15 activates clamper 16 which clamps substrate 11 by forcing the substrate voltage toward ground potential (zero volts), which in this instance is VSS. When substrate 11 becomes less negative than the set point of detector 15, detector 15 deactivates clamper 16.

Therefore, in operation, first loop 17 provides a first clamping level and second loop 18 provides a second clamping level, wherein the clamping point of loop 18 is more negative then the clamping point of loop 17. In effect, a window is formed in which substrate 11 will maintain its VBB value.

Figure 2:
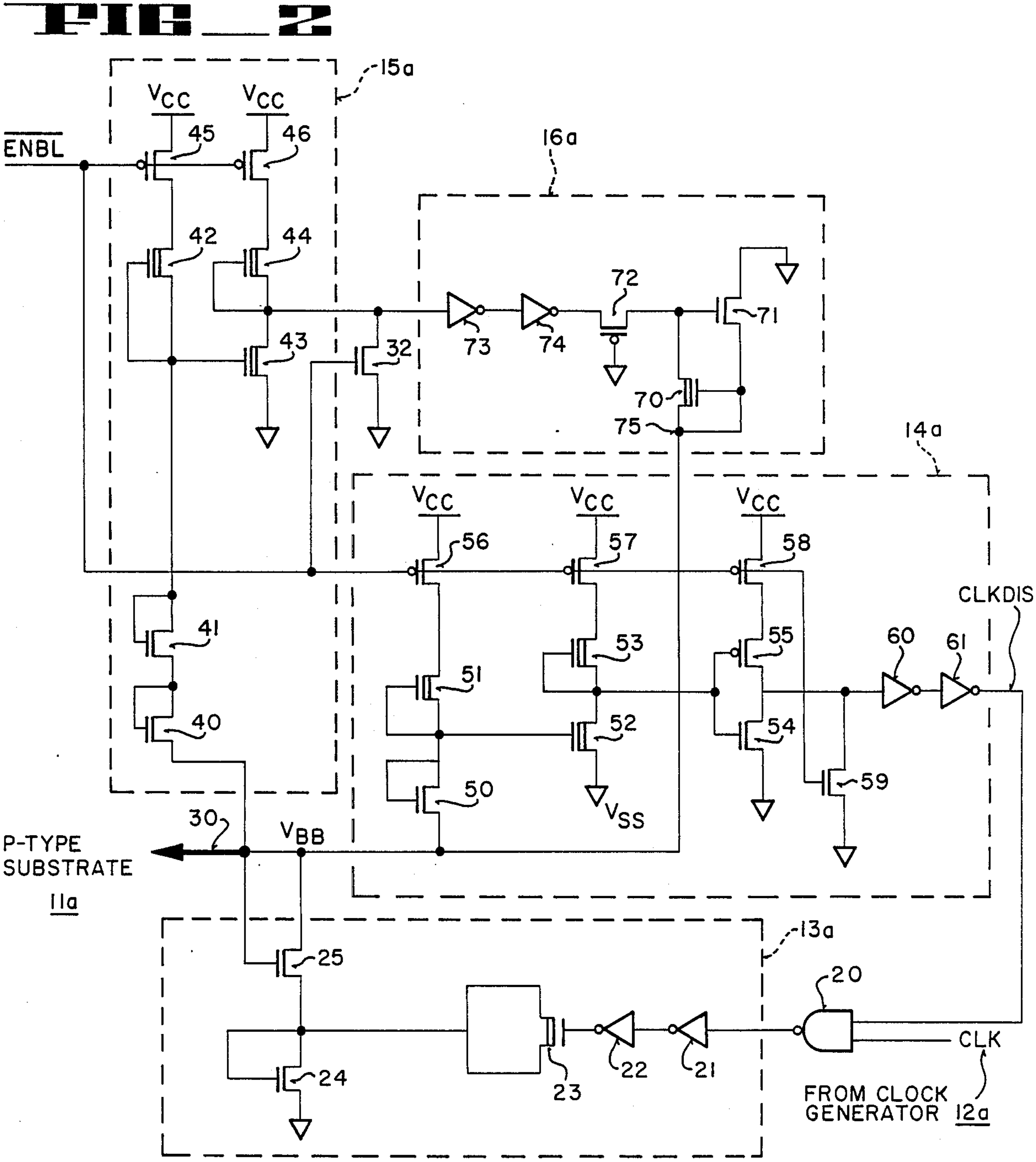
FIG. 2 is a circuit schematic diagram of the preferred embodiment.

Referring to FIG. 2, component level schematic diagram of the circuit 10 of FIG. 1 is shown. Substrate 11 of the preferred embodiment is comprised of a p-type substrate. Various blocks of FIG. 1 are also shown in FIG. 2 with the addition of lower case letter "a" affixed as a suffix to each corresponding designation of FIG. 1. A clock generator which functions equivalently to the oscillator 12 of FIG. 1 is not shown, however, the clock signal CLK provides the clocking/oscillating frequency to a charge pump 13*a*. A variety of prior art oscillators with sufficiently stable frequency in the desired operating range can be used to generate clock signal CLK. The CLK signal, as well as the clock disable sigaal CLKDIS from level detector, are coupled as input to NAND gate 20. The output of the NAND gate 20 is coupled through two stages of inverters 21 and 22 to the gate of transistor 23. The two terminals of transistor 23 are coupled to the drain and gate of transistor 24 and to the source of transistor 25. The source of transistor 24 is coupled to ground. The drain and gate of transistor 25 are coupled to line 30, which is VBB of the substrate. Transistors 24 and 25 are enhancement type devices and transistor 23 is a depletion type device.

In reference to level detector 14*a*, a chip enable signal $\overline{\text{ENBL}}$ is coupled as an input to the gates of transistors 56, 57 and 58. Transistors 50, 51 and 56 are coupled in series between VCC and VBB on line 30. Gates of transistors 50, 51, 52 and the drain of transistor 50 are coupled together to the source of transistor 51. Transistors 52, 53 and 57 are coupled in series between VCC and ground. Transistors 54, 55 and 58 are also coupled in series between VCC and ground. Gates of transistors 53–55 and the drain of transistor 52 are coupled together to the source of transistor 53. The control signal CLKDIS which controls the gating of CLK to activate the charge pump is derived at the junction of transistors 54 and 55. This output is coupled through two stages 60 and 61 and is presented as an output of detector 14*a*. The $\overline{\text{ENBL}}$ signal which is coupled to the gates of transistors 56–58 is also coupled to the gate of transistor 59. The drain of transistor 59 is then coupled to the junction of transistors 54 and 55 and the source of transistor 59 is coupled to ground. In the preferred embodiment, transistors 50, 54 and 59 are n-channel enhancement devices, transistors 51–53 are n-channel depletion devices and transistors 55–58 are p-channel enhancement devices. The CLKDIS signal is coupled as an input to NAND gate 20 which permits the gating of the clock signal CLK from clock generator. The enable signal $\overline{\text{ENBL}}$ is also coupled to the excess negative voltage detector 15*a* by being coupled to the gates of transistors 45 and 46. Transistors 40, 41, 42 and 45 are coupled in series between VCC and VBB. The gate of transistor 40 is coupled to the junction of the drain of transistor 40 and source of transistor 41. The gates of transistors 41–43 are coupled to the junction of the drain of transistor 41 and the source of transistor 42. Transistors 43, 44 and 46 are coupled in series between VCC and ground. Further the gate of transistor 44 is coupled to the junction of transistors 43 and 44. Transistors 40 and 41 are n-channel enhancement devices, transistors 42–44 are n-channel depletion type devices and transistors 45 and 46 are p-channel enhancement devices. The junction of transistors 43 and 44 provide an output from the excess negative voltage detector to clamper 16*a*. This signal is passed through inverter stages 73 and 74 and then through transistor 72, which gate is coupled to ground. The output of transistor 72 is coupled to the gate of transistor 71 and also through transistor 70 to VBB. Gate of transistor 70 is coupled to the source of transistor 71 as well as to VBB. The drain terminal of transistor 71 is coupled to ground. Further the input to clamper 16*a* is coupled to the drain of transistor 32, which source is coupled to ground. The gate of transistor 32 is coupled to $\overline{\text{ENBL}}$.

When a particular chip having this substrate 11*a* is not selected, signal $\overline{\text{ENBL}}$ is high, turning off p-channel devices 45,46, and 56–58, such that supply voltage VCC is not available to activate detectors 14*a* and 15*a*. Further, transistors 32 and 59 conduct forcing the input to the clamper 16*a* to ground potential and forcing signal CLKDIS to a low state, respectively. However, when the chip is selected $\overline{\text{ENBL}}$ goes low causing transistors 45, 46, and 56–58 to conduct, activating detectors 15*a* and 16*a*. Transistors 32 and 59 are deactivated.

Once detectors 15*a* and 14*a* are activated, CLKDIS signal from the detector 14*a* will control the input to the charge pump 13*a* by allowing the CLK signal to gate NAND gate 20. Charge pump 13*a*, when activated by a signal to the gate of transistor 23, will permit transistors 24 and 25 to control the pumping of charge to line 30. Detector 15*a* controls the excess negative voltage of VBB by clamping VBB to the potential present at node 75 at the junction of the sources of transistors 70 and 71.

The first reference level is determined by the level detector which controls the threshold VBB level to the p-type substrate 11*a*. When signal $\overline{\text{ENBL}}$ is low activating level deteector 14*a*, the switching (trip) point of the circuit comprised of transistors 52, 53 and 57 is determined by:

$$V_{sw} = Vtd_{52/53} - Vtd_{52/53}\sqrt{\frac{(W/L)_{53}}{(W/L)_{52}}} \quad \text{(Equation 1)}$$

Where

Vsw=voltage at switching point

Vtd=threshold voltage of the depletion devices (52/53)

W/L=width to length ratio of the MOS transistor (52 and 53)

The input to this transistor circuit leg is the signal from the drain of transistor 50 and the source of transistor 51. The input to gate 52 is always an enhancement threshold voltage higher than VBB due to transistor 50. Thus at the switching point of the circuit comprised of transistors 52, 53 and 57, the following equation results:

$$VBB + Vte_{50} = Vtd_{52/53} - Vtd_{52/53}\sqrt{\frac{(W/L)_{53}}{(W/L)_{52}}} \quad \text{(Equation 2)}$$

Where

Vte=threshold voltage of the enhancement device (50).

Solving for the value of VBB at the switching (detection) point of detector 14*a*, which is the value of the first reference level, yields:

$$VBB = Vtd_{52/53} - Vte_{50} - Vtd_{52/53}\sqrt{\frac{(W/L)_{53}}{(W/L)_{52}}} \quad \text{(Equation 3)}$$

An approximate expression of:

$$VBB = Vtd_{52/53} - Vte_{50} \quad \text{Equation 4)}$$

ps is derived, if $$\frac{(W/L)_{53}}{(W/L)_{52}} << 1 \quad \text{(Equation 4)}$$

This is the first reference level.

The junction of the drain of transistor 52 and source of transistor 53 is coupled to the gates of transistors 54 and 55. Transistors 54 and 55 provide a complimentary output to the input of the stages 60 and 61. The junction of transistors 50 and 51 is at $VBB + Vte_{50}$. When this junction becomes more negative than $Vt_{52}$, transistor 52 shuts off and transistor 53 pulls the junction at the drain of transistor 52 to Vcc which causes the CLKDIS to go low and disabling the CLK signal to charge pumps 13*a*. A low (Vss) is coupled to inverter 60 for ensuring that the output of NAND gate 20 stays high. When VBB is less negative than the first reference level, the opposite condition occurs and transistor 52 conducts placing a high state Vcc to inverter 60, enabling the CLK signal to reach the charge pump 13*a*.

The output of level detector 14*a* is the CLKDIS signal which activates the gating of the clock signal through NAND gate 20. THe switching point of the level detector 14*a* described above illustrates power supply rejection because it has a "current source" devices 51 and 53 coupled as loads for the two transistor legs of the circuit of detector 14*a* for the purpose of providing substantially constant current as power supply voltage varies.

In order to evaluate the temperature sensitivity of VBB, from Equation 3:

$$\frac{dVBB}{dT} = \left(1 - \sqrt{\frac{(W/L)_{53}}{(W/L)_{52}}}\right)\frac{dVtd}{dT} - \frac{dVte}{dT} \quad \text{(Equation 5)}$$

Or the approximate expression $$\frac{dVBB}{dT} = \frac{dVtd}{dT} - \frac{dVte}{dT} \quad \text{(Equation 6)}$$

From R. A. Blauschild et al.; "A New NMOS Temperature-Stable Voltage Reference"; IEEE Journal of Solid State Circuits; Vol. SC-13, pp. 744–764; December 1987, the differences between an enhancement and a depletion device threshold voltage is an approximate temperature independent number. Wherein based on the standard expressiosn for the threshold voltage of a MOS transistor the following equation results.

$$\begin{aligned} VBB &= Vtd - Vte \quad \text{(Equation 7)} \\ &= \phi bi - 2|\phi p| - \frac{Qi}{C} - |Qd|\left(\frac{1}{Cox} - \frac{1}{c}\right) \end{aligned}$$

Where

φbi=built in potential between channel and the substrate

2|φp|=voltage required for inversion in the channel

Qi=implanted charge per unit area of the channel

Qq=charge per unit area in the inversion layer

Cox=gate oxide capacitance per unit area

C=series coupling of Cox and the capacitance as defined by the depth of the implanted channel Following approximation of:

C=Cox

2|φ=φbi yields:

$$VBB = Vtd - Vte = -\frac{|Qi|}{C} \quad \text{(Equation 8)}$$

all of the temperature sensitive terms have been cancelled in Equation 8 . The magnitude of the implanted charge and gate oxide thickness will to the first order determine the value of the back bias voltage VBB. Both temperature dependence and power supply voltage dependence have been to the first order eliminated.

VBB will continiue to pump the substrate to a more negative value as long as the clock signal is supplied or until the current sourcing limitations of the pump 13*a* are reached. The regulation is accomplished by turning off the clock to the pump 13*a* when VBB reaches the appropriate first reference level. This first reference level is set by the switching point of the level detector 14*a*. As soon as the first reference level of the detector 14*a*, which is Vtd−Vte, is exceeded, the pumping action is disabled and VBB is held at that level. Due to the current loading, VBB will continue to move toward a more positive value tripping the switch and enabling the pump 13*a*. Although VBB may have a certain voltage ripple due to the switching sequence, the ripple will not have any significant influence on the operation of the device, because the gain of the detector 14*a* is of a sufficient value. This assumption is based on the fact that the pump 13*a* is capable of delivering the necessary current at the regulated level. Therefore it is the level detector 14*a*, and not charge pump 13*a* which determines the VBB level under all conditions.

As to the function of the excess negative voltage detector 15*a*, the switching point of this circuit, which is the second reference level, is approximately given by:

$$VBB = Vtd - 2Vte \quad \text{(Equation 9)}$$

assuming that $Vte_{40} = Vte_{41}$ and Equations 1–8 are followed.

If VBB becomes more negative than this second reference level, the detector 15*a* will activate clamper 16*a*. The level detection is achieved equivalently to that accomplished by transistors 50, 51, 52 and 53 of level detector 14*a*. In detector 15*a* two enhancement devices 40 and 41 are used instead of the one enhancement device 50 used in detector 14*a* . Thus, the coefficient 2 in Equation 9. If VBB becomes more negative than this second reference level, detector 15*a* will activate clamper 16*a*. Clamper 16*a* when activated will pull VBB towards ground potential through transistor 71. However, once VBB becomes less negative than this second reference level, this action will cause detector 15*a* to change its state and thus stop the clamping action of clamper 16*a*. Essentially, detector 15*a* and clamper 16*a* provide a negative voltage limiter, limiting the maximum negative value that VBB may attain.

The two detectors 14*a* and 15*a* maintain the voltage value of VBB within a zone formed by the upper and lower limits determined by the first and second reference levels, respectively. The reference levels can be adjusted by increasing the number of enhancement transistors in the leg of the circuit coupled to VBB in each of the detectors 14*a* and 15*a*. However, this will affect the temperature stability of VBB since the best temperate stability is achieved when a signal enhancement device is combined with the depletion device in the detector circuit. The requirement is that detector 15*a* have at least one more enhancement device than detector 14*a*.

Thus a circuit for controlling MOS substrate back bias voltage is described.

I claim:

1. A circuit for controlling substrate bias in a metal-oxide-semiconductor (MOS) intergrated circuit, comprising:

an oscillator for generating an oscillation signal;

a charge pump coupled to said oscillator and to a substrate of said MOS intergrated circuit for charging said substrate when said charge pump is driven by said oscillation signal;

a first detector coupled to said substrate and to said oscillator for monitoring a bias voltage of said substrate and being responsive to said bias voltage by activating said charge pump when magnitude of said bias voltage falls below a predetermined threshold level;

a second detector coupled to said substrate for monitoring said bias voltage of said substrate and being responsive to said bias voltage when magnitude of said bias voltage exceeds a predetermined limit level;

a clamper means coupled to said substrate and to said second detector, wherein when said second detector detects said bias voltage exceeding said predetermined limit level, said clamper means is activated to limit said bias voltage;

such that said substrate bias is controlled by maintaining said bias voltage at a value between said predetermined threshold level and said predetermined limit level.

2. The circuit of claim 1, wherein said first detector is comprised of:

a first transistor and a second transistor coupled in series between a supply voltage and said bias voltage, wherein gates of said first and second transistors are coupled together to a common junction of said first and second transistors;

third and fourth transistors coupled in series between said supply voltage and its return, wherein said junction of said first and second transistors is coupled to the gate of said third transistor such as to control biasing of said third transistor;

said third and fourth transistors for determining a switching on point of said first detector, wherein said switching on point is determined at a junction of said third and fourth transistors.

3. The circuit of claim 2 wherein said second detector is comprised of:

fifth, sixth and seventh transistors coupled in series between said supply voltage and said bias voltage, wherein said fifth transistor is coupled between said supply voltage and a control node and said sixth and seventh transistors are coupled in series between said node and said bias voltage;

eighth and ninth transistors coupled between said supply voltage and its return, wherein an output of said second detector is taken from a junction of said eighth and ninth transistors and said control node is coupled to the gate of said eighth transistor, such as to control biasing of said eighth transistor;

said eighth and ninth transistors for determining a switching on point of said second detector, wherein said switching on point of said second detector is determined at a junction of said eighth and ninth transistors.

4. A circuit of claim 3 wherein a current source is utilized as a load device in each of said first and second detectors.

5. The circuit of claim 4 wherein said clamper is comprised of a tenth transistor coupled to said second detector output, such that when said second detector activates said clamper, said tenth transistor is activated to couple power return to said substrate such that said substrate is coupled for discharging to said power return to limit said bias voltage.

6. A circuit for controlling substrate bias in a metal-oxide-semiconductor (MOS) intergrated circuit substantially independent of power supply and temperature variations, comprising:

clocking means for generating a clocking signal;

a charge pump coupled to said clocking means and to a substrate of said MOS intergrated circuit for charging said substrate when said charge pump is driven by said clocking signal;

a first detector coupled to said substrate and to said clocking means for monitoring a bias voltage of said substrate and being responsive to said bias voltage by activating said charge pump when a magnitude of said bias voltage falls below a predetermined threshold level;

a second detector coupled to said substrate for monitoring said bias voltage of said substrate and being responsive to said bias voltage when a magnitude of said bias voltage exceeds a predetermined limit level;

a clamper coupled to said substrate and to said second detector, wherein when said second detector detects said bias voltage exceeding said predetermined limit level, said clamper is activated to limit said bias voltage to said predetermined limit level;

such that said substrate bias is controlled by maintaining said bias voltage at a value between said predetermined threshold level and said predetermined limit level.

7. The circuit of claim 6 wherein said first detector is comprised of:

a first transistor of an enhancement type having its source coupled to said substrate and its gate an drain coupled to a first junction node;

a second transistor of a depletion type having its source and gate coupled to said first junction node and its drain couple to a supply voltage through a first load transistor;

a third transistor of a depletion type having its source coupled to a return of said supply voltage, its gate coupled to said first junction node and its drain coupled to a second junction node;

a fourth transistor of a depletion type having its source and gate coupled to said second junction node and its drain coupled to said supply voltage through a second load transistor;

said first detector causing said clocking means to be activated when said third transistor conducts more than said fourth transistor;

said third transistor conduction being determined by a voltage on said first junction node which voltage is determined by said bias voltage.

8. The circuit of claim 7 wherein said second detector is comprised of:

a fifth transistor of an enhancement type having its source coupled to said substrate;

a sixth transistor of an enhancement type having its source coupled to drain and gate of said fifth transistor and having its gate and drain coupled to a third junction node;

a seventh transistor of a depletion type having its source and gate coupled to said third junction node and its drain coupled to said supply voltage through a third load transistor;

a eighth transistor of a depletion type having its source coupled to said supply return, its gate coupled to said third junction node and its drain coupled to a fourth junction node;

a ninth transistor of a depletion type having its gate and source coupled to said fourth node and its drain coupled to said supply voltage through a fourth load transistor;

said eighth and ninth transistors for determining the activation of said second detector wherein when said eighth transistor conducts less than said ninth transistor, said second detector activates said clamper;

said eighth transistor conduction being determined by a voltage on said third junction node, which voltage is determined by said bias voltage.

9. The circuit of claim 8 wherein said first, second, third and fourth load transistors are comprised of p-channel devices and other said transistors are comprised of n-channel devices.

10. The circuit of claim 9 wherein said clocking means further includes a gating means for gating said clocking signal to said charge pump only when said first detector activates said gating means.

11. The circuit of claim 10 wherein said gating means is comprised of a NAND gate.

12. The circuit of claim 11 wherein said clamper is comprised of a tenth transistor having its gate coupled to said second detector, such that when said bias vottage exceeds said predetermined limit level, said tenth transistor is activated to place said supply return having a ground potential on said substrate such that said substrate is charges through said tenth transistor to control maximum voltage of said bias voltage to said predetermined limit level.

13. The circuit of claim 8 wherein said first and fifth transistors are actually comprised of a plurality of enhancement transistors coupled in series.

* * * * *